(12) United States Patent
Nikolaev et al.

(10) Patent No.: US 6,218,269 B1
(45) Date of Patent: Apr. 17, 2001

(54) PROCESS FOR PRODUCING III-V NITRIDE PN JUNCTIONS AND P-I-N JUNCTIONS

(75) Inventors: Andrey E. Nikolaev; Yuri V. Melnik; Konstantin V. Vassilevski, all of St. Petersburg (RU); Vladimir A. Dmitriev, Bethesda, MD (US)

(73) Assignee: Technology and Devices International, Inc., Gaithersburg, MD (US)

( * ) Notice: Subject to any disclaimer, the term of this patent is extended or adjusted under 35 U.S.C. 154(b) by 0 days.

(21) Appl. No.: 09/195,217

(22) Filed: Nov. 18, 1998

Related U.S. Application Data

(60) Provisional application No. 60/066,940, filed on Nov. 18, 1997.

(51) Int. Cl.[7] .............................. H01L 21/20; H01L 21/36
(52) U.S. Cl. ...................... 438/518; 438/505; 438/479; 117/952
(58) Field of Search .................................... 438/518, 519, 438/542, 546, 930, 925, 919, 479, 495, 505, 508, 914; 117/952

(56) References Cited

U.S. PATENT DOCUMENTS

| | | |
|---|---|---|
| 3,683,240 | 8/1972 | Pankove . |
| 3,819,974 | 6/1974 | Stevenson et al. . |
| 3,849,707 | 11/1974 | Braslau et al. . |
| 3,922,703 | 11/1975 | Pankove . |
| 4,095,331 | 6/1978 | Rutz . |
| 4,144,116 | 3/1979 | Jacob et al. . |
| 4,268,842 | 5/1981 | Jacob et al. . |
| 4,396,929 | 8/1983 | Ohki et al. . |
| 5,210,051 * | 5/1993 | Carter, Jr. .............................. 438/518 |
| 5,243,204 * | 9/1993 | Suzuki et al. ........................... 257/77 |
| 5,290,393 | 3/1994 | Nakamura . |
| 5,306,662 | 4/1994 | Nakamura et al. . |
| 5,387,804 | 2/1995 | Suzuki et al. . |
| 5,393,993 | 2/1995 | Edmond et al. . |
| 5,416,342 | 5/1995 | Edmond et al. . |
| 5,432,808 | 7/1995 | Hatano et al. . |
| 5,523,589 | 6/1996 | Edmond et al. . |
| 5,578,839 * | 11/1996 | Nakamura et al. ..................... 257/96 |
| 5,620,557 * | 4/1997 | Manabe et al. ....................... 438/507 |
| 5,650,641 * | 7/1997 | Sassa et al. ............................ 257/88 |
| 5,767,533 * | 6/1998 | Vydyanath ............................. 257/87 |
| 5,846,844 * | 12/1998 | Akasaki et al. ...................... 438/518 |
| 5,888,886 * | 3/1999 | Sverdlov et al. .................... 438/505 |
| 5,993,542 * | 11/1999 | Conclusion et al. ................... 438/46 |

OTHER PUBLICATIONS

I. Akasaki et al., "Widegap Column–III Nitride Semiconductors for UV/Blue Light Emitting Devices", J. Electronchem. Soc., vol. 141, No. 8, Aug. 1994, pp. 2266–2271.

M. Sano et al., "Epitaxial Growth of Undoped and Mg–Doped GaN", Japanese Journal of Applied Physics, vol. 15, No. 10, Oct. 1976, pp. 1943–1950.

T. Detchprohm et al., "The homoepitaxy of GaN by metalorganic vapor phase epitaxy using GaN substrates", Journal of Crystal Growth, No. 137, 1994, pp. 170–174.

H.P. Maruska and D.A. Stevenson, "Violet luminescence of Mg–doped GaN", Appl. Phys. Lett., vol. 22, No. 6, Mar. 15, 1973, pp. 303–305.

(List continued on next page.)

*Primary Examiner*—Mary Wilczewski
(74) *Attorney, Agent, or Firm*—David G. Beck; McCutchen, Doyle, Brown & Enersen, L.L.P.

(57) ABSTRACT

A process is disclosed for producing pn junctions and p-i-n junctions from group III nitride compound semiconductor materials. The process comprises growing of pn junctions and p-i-n junctions by hydride vapor phase epitaxy employing hydride of nitrogen (ammonia, hydrozine) as a source of nitrogen and halides of group III metal as a source of metal. Mg is used as acceptor impurity to form p-type III-V nitride layers. The preferred sources for Ga and Al are Ga and Al metals, respectively. The process is carried out in the temperature range from 900 to 1200° C.

12 Claims, 4 Drawing Sheets

OTHER PUBLICATIONS

M. Asif Khan et al., "Violet–blue GaN homojunction light emitting diodes with rapid thermal annealed p–type layers", Appl. Phys. Lett., vol. 66, No. 16, Apr. 17, 1995, pp. 2046–2047.

S. Nakamura et al., "Highly P–Typed Mg–Doped GaN Films Grown with GaN Buffer Layers", Japanese Journal of Applied Physics, vol. 30, No. 10A, Oct. 1991, pp. L1708–L1711.

I. Akasaki et al., "Photoluminescence of Mg–doped p–type GaN and electroluminescence of GaN p–n junction LED", Journal of Luminescence 48 & 49, 1991, pp. 666–670.

S. Nakamura et al., "High–Power GaN P–N Junction Blue–Light–Emitting Diodes", Japanese Journal of Applied Physics, vol. 30, No. 12A, Dec. 1991, pp. L1998–L2001.

Y.V. Melnik et al., "High-quality GaN grown directly on SiC by halide vapour phase epitaxy", Inst. Phys. Conf. Ser. No. 142: Chapter 5, 1996 IOP Publishing Ltd., pp. 863–866.

* cited by examiner

PROCESS FOR PRODUCING III-V NITRIDE PN JUNCTIONS AND P-I-N JUNCTIONS

The present invention claims priority of U.S. provisional application No. 60/066,940 filed Nov. 18, 1997.

FIELD OF THE INVENTION

The present invention relates to a method of manufacturing semiconductor pn junctions and p-i-n junctions to be used in semiconductor devices, for example light emitting diodes, laser diodes, heterojunction bipolar transistors, or photo detectors and more specifically, to a process of producing pn junctions and p-i-n junctions in III-V nitride compound semiconductor, for example GaN.

BACKGROUND OF THE INVENTION

Pn junctions and p-i-n junctions are the key elements of many semiconductor devices including light emitters, rectifying pn diodes, photo detectors, transistors, and thyristors. Semiconductor pn junction consists of two material regions, one of which has n-type electrical conductivity (electron type conductivity), and another region with p-type electrical conductivity (hole electrical conductivity). Conductivity type of semiconductor material can be controlled by the introducing impurity atoms into semiconductor material. For example, n-type conductivity of GaN semiconductor may be caused by the introduction of silicon atoms into GaN, and p-type conductivity of GaN semiconductor may be caused by the introducing of magnesium atoms in GaN. One of widely used technological methods to form pn junction is epitaxial growth of semiconductor material with one conductivity type on the surface of semiconductor material with another conductivity type. In the case of p-i-n junctions, insulating material (i-type material), for example i-type GaN, is located in between p-type and n-type regions.

Compound semiconductors based on III-V nitrides, for example GaN, AlN, AlGaN, or InAlGaN have been consider as promising materials for electronic and optoelectronic devices for long time due to their unique physical and electronic properties, in particular, direct band-gap structure, a high electric breakdown field, and a high thermal conductivity. AlGaN and GaInN material systems form continues alloys, which cover band-gap energy range from 1.9 eV (InN) to 6.2 eV (AlN). These fundamental properties make these materials very attractive for semiconductor electronic applications, including light emitters, photodetectors, microwave transistors. For long time, development of semiconductor devices based on III-V nitride semiconductors has been limited by lack of the material having p-type electrical conductivity. Because of this reason, pn junctions and p-i-n structures based on III-V nitrides did not exist that time. The breakthrough took place on 1989 when the development of p-type GaN was reported, for the first time. Following advance in the epitaxial growth and doping of GaN and AlGaN has paved the way for the development of full set of GaN-based semiconductor devices employing pn junctions or p-i-n junctions. GaN-based light emitter diodes (LEDs), laser diodes, ultra violet (UV) photo detectors, have been demonstrated.

All the above results on the fabrication of III-V nitride pn junctions were obtained using metal organic chemical vapor deposition (MOCVD) technique and, to some extend, by molecular beam epitaxy (MBE).

The most advanced results have been demonstrated by MOCVD technique, which includes the growth of III-V nitride epitaxial layer from vapor phase using Mg as acceptor impurity and the following anneal of the grown structure in order to produce p-type material. In this method, III-V nitride compound semiconductor is grown from the vapor phase using metal organic gases as sources of group III metals, for example trimethylaluminum (TMA) is used as aluminum source and trimethylgallium (TMG) is used as gallium source. Ammonia is usually used as nitrogen source. Growth of III-V nitride semiconductor takes place in reactor chamber on a substrate. During the growth, the substrate is kept at growth temperature ranged from 800 to 1100° C. Single crystal wafers of sapphire or silicon carbide serve as substrates for III-V nitride deposition by MOCVD method. As a result of such MOCVD process, thin layers (usually not thicker than 5 microns) of III-V nitride compound semiconductors can be grown on a substrate. In order to control electrical properties of the grown material, for example type of electrical conductivity, electrically active impurities are introduced in the reaction chamber during the growth. Undoped III-V nitrides usually exhibit n-type conductivity. The value of n-type conductivity can be controlled by introducing Si impurity (in form of $SiH_4$ gas, for example) in the reaction chamber during the growth. In order to obtain p-type III-V nitride material by MOCVD method, Mg impurity is introduced in the reactor chamber during the growth. Biscyclopentadienylmagnesium ($Cp_2Mg$) is used as a Mg source for III-V nitride doping. In order to form a pn junction, first MOCVD growth process is carried out using one type of impurity, for example Si donor impurity, to form n-type layer of III-V nitride semiconductor, and after that the second layer doped with another impurity, for example Mg acceptor impurity, to form p-type layer is grown by MOCVD process. As grown Mg doped material grown by MOCVD is highly resistive, and in order to activate p-type conductivity, high temperature post-growth anneal in nitrogen atmosphere is required. This procedure has been applied to form high quality GaN and AlGaN pn junctions. In the case of p-i-n structure, insulating layer (i-type) of III-V nitride is grown by MOCVD in between p-type and n-type layers. Recent progress in MOCVD technology for III-V nitride compound semiconductors resulted in the commercialization of a number of advanced semiconductor devices, including UV, blue, and green light emitting diodes.

However, the MOCVD technology has a number of limitations.

(1) This is expensive method requiring complicated growth equipment. In order to form III-V nitride pn junctions and p-i-n junctions by MOCVD process, metal organic sources, for example TMA (Al source) and TMG (Ga source) must be used.

(2) Complicated chemical compounds have to be used as acceptor impurity sources, for example biscyclopentadienyl-magnesium ($Cp_2Mg$) is usually used as a Mg source.

(3) The MOCVD method does not provide a growth rate for III-V nitride growth higher than a few microns per hr (usually less than 3 microns/hr), which leads to long growth runs. For device structures, which require thick layers (for example high voltage rectifier diodes with base region of about 30 microns thick), the MOCVD technology can not be practically employed.

(4) Another disadvantage of the MOCVD method is that n-type AlGaN layers grown by MOCVD are insulating, if AlN concentration is high (>50 mol. %). This fact limits the AlN concentration in III-V nitride layers forming the pn junction.

(5) In order to form high-quality III-V nitride material on SiC substrates, MOCVD method requires to grow a buffer layer in-between SiC and III-V nitride, which makes impossible to fabricate devices utilizing direct contact between SiC and GaN such as SiC/GaN pn junction, particularly n-SiC/p-GaN junction.

(6) Usually, III-V nitride pn junctions grown by MOCVD require post-growth anneal to activate acceptor impurities and obtain p-type material.

There were a number of attempts to develop an alternative epitaxial growth technique to form III-V nitride pn junctions and p-i-n junctions. One method, which has been considered as a promising technique for the fabrication of III-V nitride device structures, is hydride vapor phase epitaxy (HVPE). HVPE (halide-hydride vapor phase epitaxy) means the technique for epitaxy during which the deposition of compound semiconductor (e.g. $A^{III}N$ or solid solution $A^{III}_x B^{III}_y C^{III}_{1-x-y}N$, where x+y<1, and A, B, C are the metal of group III of the periodic system) occured on heated substrate from vapour phase and the metal is transported using metal halide e.g. $A^{III}B^{VII}$ or $A^{III}B^{VII}_3$ (GaCl, AlCl$_3$, AlBr$_3$ etc).

The HVPE method is convenient for mass production of semiconductor devices due to its low cost, flexibility of growth conditions, and good reproducibility. In this method, Ga metal and Al metal are used as source materials, thus HVPE technology does not require expensive source materials. The principals of the HVPE technology are well-known. Due to the high growth rate (up to 100 microns/hr), the HVPE technique can be used for the deposition of thick GaN layers.

Recently, significant progress has been achieved in HVPE growth of III-V nitride compound semiconductor materials. It was shown that AlGaN and AlN layers, as well as AlGaN/GaN heterostructures can be grown by HVPE technique. The AlGaN alloys grown by HVPE were found to be electrically conductive up to 70 mol. % of AlN. Furthermore, since these GaN layers were grown directly on conducting SiC wafers without insulating buffer layers, diodes with n-GaN/p-SiC heterojunctions were fabricated by HVPE.

Nevertheless, p-type III-V nitride semiconductor has not been produced by conventional HVPE technique, and therefore semiconductor devices utilizing pn junctions and p-i-n structures have not been created. It was shown that Mg metal may be used as a source of Mg acceptor impurity for III-V nitride semiconductor in the HVPE method, thus expensive magnesium source such as biscycropentadienylmagnesium is not required. However, Mg doping in conventional HVPE technique has resulted in the growth of insulating (i-type) III-V nitride materials, not p-type material. All attempts to fabricate p-type III-V nitride materials by HVPE techniques were unsuccessful. As a result, potential advantages of the HVPE technique for III-V nitride materials were not realized for semiconductor devices requiring pn junctions or p-i-n junctions such as light emitting pn diodes, pn diode rectifiers, p-i-n photodetectors, and heterojunction bipolar transistors.

Although, some theoretical explanations for p-type material formation in III-V nitride compound semiconductors are proposed, the mechanisms of this phenomena are not yet entirely clear, and the inventors do not wish to be bound by the theory.

Thus, although the HVPE method offers tremendous potential for the fabrication of III-V compound semiconductor devices, such devices have not been created because of the failure of HVPE technique to produce p-type III-V nitride materials.

SUMMARY OF THE INVENTION

The present invention allows p-type III-V nitride compound semiconductor materials, pn junctions and p-i-n junctions to be produced.

Another advantage of the invention is in significantly reducing cost of the growth equipment and of the growth process for producing p-type III-V nitride compound semiconductor materials, pn junctions and p-i-n junctions.

Another advantage is in increasing growth rate of the formation p-type and n-type layers of III-V nitride compound semiconductors forming the pn junction.

Another advantage is in increasing growth rate of the formation p-type, i-type, and n-type layers of III-V nitride compound semiconductors forming the p-i-n junction.

Another advantage is in increasing AlN concentration in III-V nitride compound semiconductor material forming the pn junction or p-i-n junction.

Another advantage is in forming p-AlGaN/n-SiC pn junctions.

Another advantage is in forming III-V nitride compound semiconductor pn junction and p-i-n junction without use of post-growth anneal.

The present invention provides a novel method of manufacturing p-type material comprising the step of growing a III-V nitride compound semiconductor layer having a group III metal, using metal halide as a source of the group III metal. The III-V nitride compound semiconductor layer has first concentration of electrically active donors and second concentration of electrically active acceptors. The first concentration is higher than the second concentration. Acceptor impurity is introduced into the III-V nitride compound semiconductor layer to produce a p-type layer having third concentration of electrically active donors and fourth concentration of electrically active acceptors. The fourth concentration is higher than the third concentration. For example, the fourth concentration is in a range between about $10^{17}$ cm$^{-3}$ and about $10^{21}$ cm$^{-3}$. The p-type layer may have thickness not less than 10 microns.

The third concentration may be caused by electrically active donor impurity of the III-V nitride compound semiconductor layer and by electrically active structural defects of the III-V nitride compound semiconductor layer. The acceptor impurity may be introduced to the III-V compound semiconductor layer so as to prevent number of the electrically active structural defects from being increased. The III-V nitride compound semiconductor layer is grown in a reaction chamber.

In accordance with one aspect of the invention, the acceptor impurity may comprise an acceptor impurity gas. A protection gas may be supplied so as to surround the acceptor impurity gas to prevent the acceptor impurity gas from having contact with elements of the reaction chamber.

In accordance with another aspect of the invention, the acceptor impurity may be non-gaseous substance held in a source container. The acceptor impurity is heated to produce acceptor impurity vapor carried by a carrier gas to the III-V nitride compound semiconductor layer. The source container may be made of material inert to action of the non-gaseous acceptor impurity substance to prevent contamination of the acceptor impurity vapor and the carrier gas by impurities. A protection gas may be provided so as to surround the carrier gas, to prevent the acceptor vapor from having contact with elements of the reaction chamber.

In accordance with a further aspect of the invention, the metal halide is produced using a chemical reaction of a reaction gas with a metal surface. Chemical cleaning of the metal surface is performed to prevent contamination of the metal halide. The chemical cleaning may comprise etching of the metal surface.

In accordance with another aspect of the invention, a novel method of forming a p-n junction comprises the step of growing a III-V nitride compound semiconductor layer having a group III metal, using metal halide as a source of the group III metal, the III-V nitride compound semiconductor layer having first concentration of electrically active donors and second concentration of electrically active acceptors. Acceptor impurity is introduced into the III-V nitride compound semiconductor layer to produce a p-type layer. An n-type layer is produced to form a p-n junction between the p-type layer and the n-type layer.

In accordance with a further aspect of the invention, a novel semiconductor device is provided. The novel semiconductor device comprises at least one p-type III-V nitride compound semiconductor layer, at least one n-type layer, and at least one III-V nitride compound semiconductor p-n junction formed by the at least one p-type layer and the at least one n-type layer. At least one of the p-type and n-type layers has a thickness not less than 10 microns.

In accordance with another aspect of the invention, a novel light-emitting device is provided. The novel light-emitting device comprises a first p-type III-V nitride compound semiconductor layer, a second n-type semiconductor layer, a pn homojunction provided between the first and the second layers, and a third III-V nitride compound semiconductor layer adjacent to one of the first and second layers and having band gap energy larger than band gap energy for the first and the second layers. The third layer may comprise AlN having concentration in a range from about 40 to about 90 mol. %.

In accordance with a further aspect of the invention, a novel light-emitting device may comprise at least one p-type III-V nitride compound semiconductor layer, and at least one n-type semiconductor layer. The at least one p-type layer is doped with impurity selected from the group consisting of CL, Br and I. Concentration of the impurity may be not less than $10^{16}$ cm$^{-3}$.

Pn junctions and p-i-n junctions of III-V nitride semiconductor material may be produced by the HVPE technology in which group III metals serve as sources of the respective group III component of III-V nitride compound, for example Ga metal serves as source of Ga for GaN growth, and halide reactive gas for example HCl reacts with the above metal forming halide compound, which is transported to the growth zone of the reactor chamber and serves as material source for III-V nitride growth.

A p-type layer may be grown by the HVPE technology and doped with magnesium during this growth, magnesium source is metallic magnesium, and magnesium is incorporated in this layer with atomic concentration sufficient to provide p-type electrical conductivity for grown material. The magnesium doped layer may have background donor concentration small enough to prevent overcompensation of electrically active magnesium impurity in the grown material. Sapphire boats may be used to keep metal sources during the growth in order to prevent interaction with hot quartz and pollution of gas phase by products of this reaction.

These and other aspects of the invention are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as described in the appended claims. The objects, advantages and features of the invention are illustrated by the accompanying drawings, wherein:

DETAILED DESCRIPTION

The invention comprises a method of producing p-type III-V nitride compound semiconductor material by the HVPE technology in which group III metals serve as sources of the respective group III component of III-V nitride compound, for example Ga metal serves as source of Ga for GaN growth, and halide reactive gas for example HCl reacts with the above metal forming halide compound, which is transported to the growth zone of the reactor chamber and serves as material source for III-V nitride growth.

In accordance with the invention, a substrate of sapphire, silicon carbide or similar single crystal substrate material is provided initially. The single crystal substrate is grown in any conventional manner. Ga and Al metals were used as source materials for group III components of the grown material. These metals were placed in the source zone of the reaction chamber. Mg metal, which was used as magnesium source for p-type doping of III-V nitride was placed in sapphire boat in the source zone of the reaction chamber. Each metal was placed in a separate channel tube of the reaction chamber. The substrate is placed in a reaction chamber. The substrate and metals being placed in the reaction chamber were etched by gaseous HCl, and epitaxial growth commenced. A layer of GaN was grown on the substrate as a result of reaction between ammonia, which was supplied in the reactor chamber from a gas tank, and gallium monochloride, which was formed by reaction of HCl gas and Ga metal and was transported to the substrate by Ar gas flow. During the growth of p-type GaN, magnesium vapor was transported to the substrate by Ar gas flow. Ar gas with flow with a rate ranged from 10 to 3000 sccm/min was passed through the channel containing hot (350–800° C.) Mg metal. Mg concentration in GaN ranged from $10^{19}$ to $10^{20}$ cm$^{-3}$. As a result of this growth process, p-type GaN layer was grown. P-type AlGaN alloy layer may be grown by the same process with addition of the aluminum trichloride to the growth zone. AlCl$_3$ is formed by chemical reaction between Al metal and HCl gas in the source zone of the reaction chamber and is transported to the growth zone by Ar gas flow.

Figure 1:
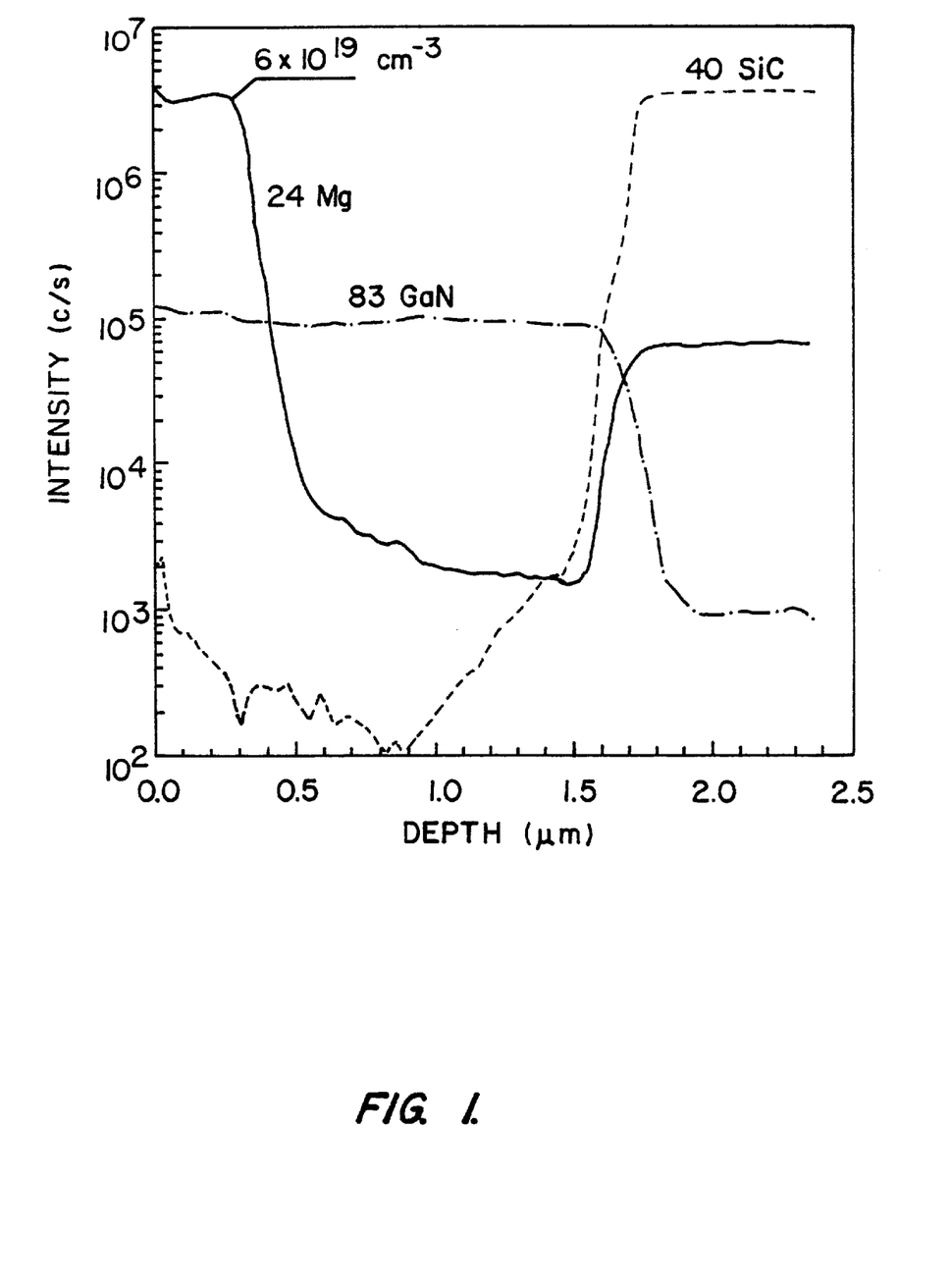
FIG. 1 shows Mg atomic depth profile measured by SIMS for GaN pn junction grown by the present invention.

In order to form pn junction, the above growth process may be done before or after the formation of n-type III-V nitride layer by the similar growth process, but without Mg doping. FIG. 1 shows Mg atomic depth profile measured by secondary ion mass spectroscopy (SIMS) for GaN pn junction grown by the invention process. For this particular pn junction, Mg doped layer was grown by the described above process on the top of n-type GaN layer. Both p-type and n-type GaN layers were grown in the same epitaxial run. Background electron carrier concentration in GaN layers was less that $10^{17}$ cm$^{-3}$.

In the case of p-i-n junction, electrically insulating (i-type) III-V nitride semiconductor material must be grown in between p-type and n-type III-V nitride layers. In order to grow i-type material, material doping with Zn or simultaneous doping with Zn and Mg may be performed. Epitaxial growth of p-type and n-type materials is performed by the above manner, and Zn doping is performed by the introducing of Zn vapor in the growth zone. The Zn vapor is transported to the growth zone by Ar gas flow from the source zone of the reaction chamber where a sapphire boat with Zn metal is placed in a separate channel tube.

Figure 4:
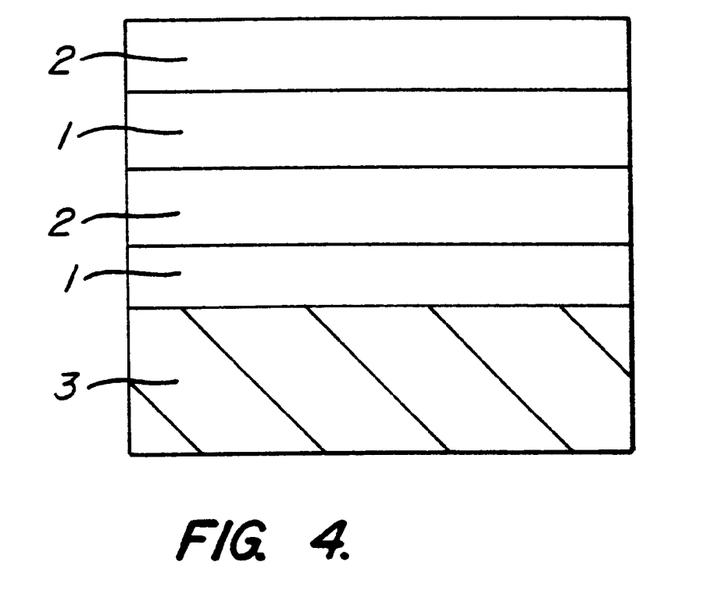
FIG. 4 is a schematic view of III-V nitride structures with pn junctions formed by the invention process: 1—p-type GaN (or AlGaN) layer, 2—n-type GaN (or AlGaN) layer, 3—substrate (SiC, GaN, Si, sapphire). In AlGaN layers forming pn junction, the AlN concentration may be the same (homojunction), or different (heterojunction).

The described above invention process can be repeated a few times to form semiconductor structures with different combinations of pn junctions as shown in FIG. 4. For example, the following structures can be formed: (1) substrate/p-AlGaN layer/n-AlGaN layer/p-AlGaN layer, (2) substrate/n-AlGaN layer/p-AlGaN/n-AlGaN layer, or (3) substrate/p-AlGaN layer/n-AlGaN layer/p-AlGaN layer/n-AlGaN layer. In AlGaN layers forming these pn junctions, the AlN concentration may be different for different layers or the same. The substrates may be made of sapphire, SiC, Si, or the like.

Figure 5:
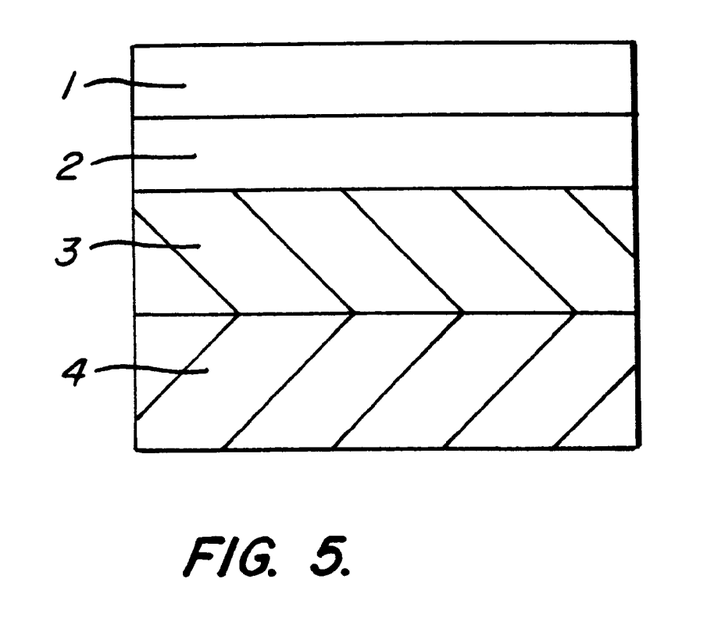
FIG. 5 is a schematic view of III-V nitride pn junction formed by the invention process on SiC substrate containing silicon carbide pn junction: 1—n-type GaN (or AlGaN) layer, 2—p-type GaN (or AlGaN) layer, 3—n-type SiC, 4—p-type SiC

The described above invention process can be used to form pn junctions between p-type III-V nitride semiconductor, for example p-type GaN, and n-type substrate, for example n-type silicon carbide (SiC). In this case, the substrate may contain a pn junction as shown in FIG. 5.

After the growth, epitaxial structure containing pn junction or p-i-n junction was unloaded from the reaction chamber. In order to prove the formation of pn junction (or the formation of p-i-n junction) and to measure its characteristics, mesa structures were formed by reactive ion etching of GaN in $CCl_2F_2$ containing gas mixture. Mesa structures with areas $1.33 \cdot 10^{-4}$ and $3.6 \cdot 10^{-5}$ cm$^2$ were fabricated.

EXPERIMENTAL PROCEDURE

The growth of III-V nitride compound semiconductors by the invention process was performed in inert gas flow at atmospheric pressure in a hot-wall horizontal reactor chamber. Semiconductor substrates (Si, SiC, GaN and sapphire) were placed on a quartz pedestal and loaded in a growth zone of a quartz reactor. Ga metal, Al metal, and acceptor impurity metal (Mg, Zn, or Mg-Zn alloy mixtures) were placed in separate boats and each boat was placed in a separate quartz tubes (channels) in the source zone of the reactor. Al and Mg (Mg+Zn) were placed in sapphire boats to prevent chemical reaction between boat material and the metal at high temperature. In some cases, Mg was supplied as Mg containing gas.

Then the reactor was filled with Ar gas. The Ar gas flow through the reactor was in the range from 1 to 25 liters per minute. Then the substrates were heated in Ar flow up to growth temperature and the metals were heated up to temperatures ranged from 350 to 800° C. HCl gas (tank of HCl gas was used for HCl supply) was introduced in the source zone (in Ga channel in case of GaN growth, and in both Al and Ga channels in case of AlGaN alloy growth). As a result of reaction between HCl and Ga (Al), gallium chloride (aluminum thrichloride) was formed and delivered to the growth zone by Ar flow. At the same time, ammonia gas (NH3) was introduced in the growth zone. As a result of reaction between gallium chloride (and aluminum thrichloride) and ammonia, single crystal epitaxial GaN layer (AlGaN layer) was grown on the substrates. The substrate temperature during the growth was constant. This temperature ranged from 800 to 1200° C. for different epitaxial runs. Depending on HCl flow rate, the growth rate of III-V nitride material ranged from 0.05 to 1 micron per minute.

In order to prevent group III nitride material contamination, surface of group III metals, which served as group III metal sources, was cleaned before the growth for example by etching by gaseous HCl.

In order to form III-V nitride pn junction, two versions of the growth process were used. In the first version, n-type GaN (or AlGaN) layer was grown followed by p-type GaN (or AlGaN) layer. In order to grow p-type material, Ar gas with sufficiently high flow rate (from 10 to 3000 sccm/min) was passed through the channel containing Mg (or Mg-Zn) alloy. In some experiments, separated channels with Mg and Zn sources were used. Mg (Mg and Zn) atoms delivered to the growth zone were incorporated in III-V nitride growing material. After the growth, all gaseous flows were stopped, except Ar, and samples were cooled down in Ar flow.

In the second version, the p-type GaN (AlGaN) material was grown first, followed by the n-type III-V nitride material grown as is described above.

The layer doped with Mg (or Mg+Zn) exhibited p-type conductivity, if Mg (Mg+Zn) atomic concentration in the material exceeded $10^{18}$ cm$^{-3}$. This concentration value (measured by SIMS) was dependent on Ar flow rate over boat (s) containing acceptor impurities and on temperature of this boat (s). As a result of the invention process, III-V nitride pn junctions were formed. Different types of the pn junctions are shown in FIG. 4,5. Characteristics of GaN pn junctions formed by the invention process are presented in FIG. 2,3 (mesa pn diodes were formed after the growth by metallization and reactive ion etching).

In order to form p-i-n junction, insulating III-V nitride layer (from 0.01 to 1 micron thick) was grown in-between p- and n-type layers. III-V nitride p- and n-type layers were grown as described above. Insulating GaN (or AlGaN) layer was obtained by low doping of the III-V nitride material with acceptors (Mg, Zn, Mg+Zn, Mg+Zn+Ga) using the invention process.

In some experiments, low acceptor doping concentration required to obtain insulating material (to form i-type layer) was obtained by adding small amount of Mg (or Mg+Zn) in Ga source material forming Mg-Zn-Ga mixture. The total concentration of Mg (Mg+Zn) in Ga source did not exceed 2 wt. %.

The III-V nitride pn junctions and p-i-n junctions were grown either in a single epitaxial run, or they were grown in two separate epitaxial runs. In the last case, the p-type material was grown in one epitaxial run and the n-type material was grown in another epitaxial run. In the case of two separate epitaxial runs, the furnace was cooled down after the first run. Samples were unloaded from the reactor and characterized. After characterization, the samples were loaded back in the furnace, and the second layer was grown on the top of the first layer by the procedure, which is described above. The surface of III-V material grown in the first run was treated before the second epitaxial run in the reactor in HCl flow at growth temperature for a few seconds.

GaN layers both n-type and p-type grown on SiC substrates by the invention method were characterized by x-ray diffraction. The measurements exhibited narrow x-ray rocking ω-scan curves (<150 arc sec).

Figure 2:
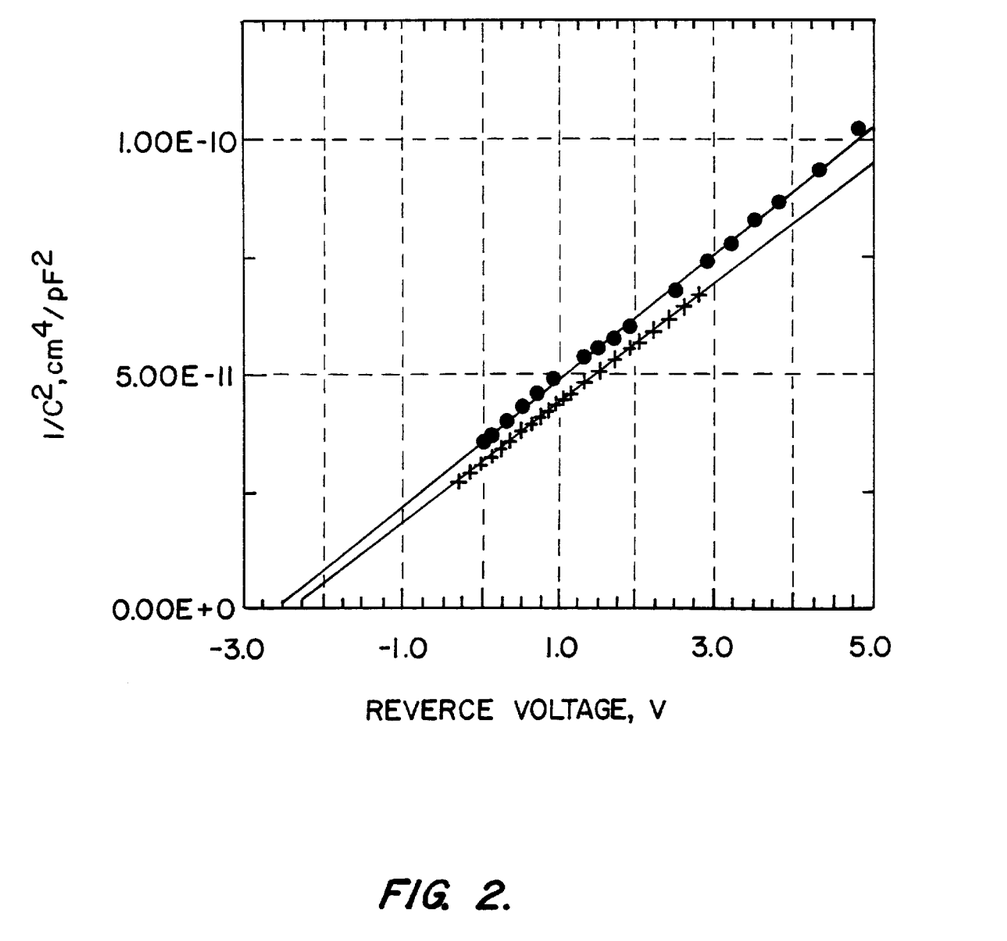
FIG. 2 shows capacitance-voltage characteristic of two GaN pn junction fabricated by the invention process.

Fabricated GaN pn diodes revealed good electrical characteristics. The current densities were less then $5 \cdot 10^{-2}$ A/cm$^2$ at applied reverse voltage up to 10 V. The forward I-V characteristics of the GaN pn junctions at high and low current density was measured for various ambient temperatures. The mesa diameter was about $1.3 \times 10^{-4}$ cm$^2$; Mg concentration measured by SIMS in p-GaN material was $2.5 \times 10^{20}$ cm$^{-3}$. Background donor concentration in undoped GaN layers was about $1 \times 10^{17}$ cm$^{-3}$. The nonideality factor was measured of 3.2; 2.8, 2.3, and 2.0 for the temperatures 20° C.; 70° C.; 140° C.; and 215° C., respectively. Thus, the fabricated pn junctions operated not only at room temperature, but also at higher temperatures. The C-V measurements were performed at a frequency of 1 MHz on the mesa-structures with area of about $3.6 \times 10^{-5}$ cm$^2$. The plot of $1/C^2$ as a function of applied voltage demonstrates that GaN pn-junctions were abrupt with cut-off voltage about 2.5 V (FIG. 2).

We investigated the electroluminescence (EL) properties of GaN pn-junctions fabricated by invention process at room temperature.

Using the invention process III-V nitride pn junctions and p-i-n junctions were formed in-between GaN layers and/or AlGaN layers having AlN concentration from 0 to 60 mol. %.

We also fabricated p-GaN/n-SiC and p-AlGaN/n-SiC pn junctions using the invention process. In this case, p-type III-V nitride layers were grown on n-type silicon carbide substrates. The said SiC substrate may contain pn junction (FIG. 5).

EMBODIMENT 1

A SiC substrate of 6H polytype and piece of the same were well washed, and placed into the growth zone of the HVPE reaction chamber. The substrates were heated up to growth temperature in Ar gas ambient. Then the substrates were etched in HCl gas stream in order to remove residual surface contamination. The temperature of substrate was kept at growth temperature of 1000° C. during the growth run. Sapphire boats with Ga metal and Mg metal were placed in a separate channel tubes in the source zone of the reaction chamber.

A layer of n-type gallium nitride was formed on the SiC substrate by transporting gallium as its gaseous monochloride and introducing nitrogen into the growth zone in the form of ammonia gas. Growth rate of GaN layer was 20 microns per hour. There was no gas flow through Mg source channel. Concentration Nd—Na, where Nd is the concentration of electrically active donors, and Na is the concentration of electrically active acceptors, was measured by a mercury probe. The Nd—Na concentration ranged from $10^{16}$ to $10^{18}$ cm$^{-1}$. This concentration was determined by both electrically active donor impurities and electrically active defects in GaN.

After the growth of the first n-type layer, the second p-type GaN layer was grown by introducing Mg impurity in the growth zone. Mg vapor was delivered to the growth zone by Ar gas flow. The separate Ar flow was used to prevent contact of Mg vapor with components of reactor chamber. The thickness of the p-type GaN layer is typically 0.5 μm with an approximate range of thickness between 0.2–1.2 μm. Growth rate of p-type GaN was about 10 microns per hour. The grown structure containing GaN pn junction was cooled down up to the room temperature in an Ar atmosphere.

The grown structure was characterized by x-ray diffraction. The full width at half maximum (FWHM) of double crystal x-ray ω-scan rocking curves for (0002) GaN reflection ranged from 80 to 150 arcsec indicating high crystal quality of the grown material. This value indicates that defect concentration is low. The Mg atomic concentration was $6 \times 10^{19}$ cm$^{-3}$ (FIG. 1). The $N_a$–$N_d$ concentration measured by a mercury probe was about $1 \times 10^{18}$ cm$^{-3}$. Composition analysis performed by secondary ion mass spectroscopy (SIMS) showed the presence of Cl atoms at the pn junction. The Cl concentration was about $2 \times 10^{16}$ cm$^{-3}$.

To investigate characteristics of pn junctions fabricated by the invention method, light emitting diodes (LED) were fabricated. Device fabrication technological stages and their sequence were as described below.

Nickel 250 nm thick was deposited by e-beam sputtering on the back-side of the 6H-SiC substrate. To form ohmic contacts to the top p-GaN layer, a 200 nm thick Ni metal film was deposited by thermal evaporation on p-type GaN. This metallization revealed contact resistance of about $R_C 4 \cdot 10^{-2}$ Ohm cm$^2$ at dc current densities up to 330 A/cm$^2$. After patterning by direct photolithography, Ni metal was used as a mask for reactive ion etching (RIE). At last, GaN layers were etched down to the SiC substrate by RIE in CCl$_2$F$_2$ containing gas mixture. Mesa structures with areas of $1.33 \cdot 10^{-4}$ and $3.6 \cdot 10^{-5}$ cm$^2$ were fabricated.

Fabricated GaN pn diodes revealed good electrical characteristics. The current densities were less then $5 \cdot 10^{-2}$ A/cm$^2$ at applied reverse voltage up to 10 V. The forward I-V characteristics of the GaN pn junctions at high and low current densities were measured for various ambient temperatures. The nonideality factor was measured of 3.2; 2.8, 2.3, and 2.0 for the temperatures 20° C.; 70° C.; 140° C.; and 215° C., respectively. Thus, the fabricated pn junctions operated not only at room temperature, but also at higher temperatures. The C-V measurements were performed at a frequency of 1 MHz on the mesa-structures with area of about $3.6 \times 10^{-5}$ cm$^2$. The plot of $1/C^2$ as a function of applied voltage demonstrates that GaN pn-junctions were abrupt with cut-off voltage about 2.5 V (FIG. 2).

Figure 3A:
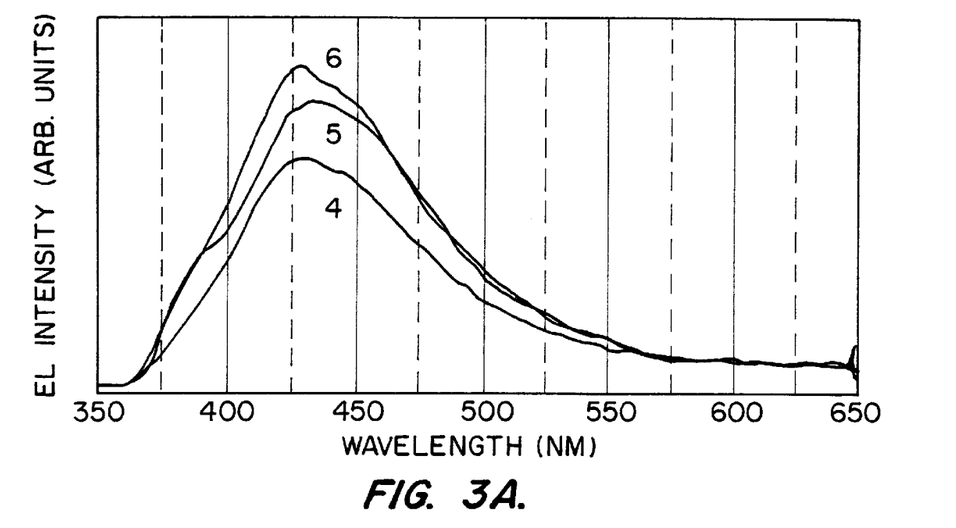
FIG. 3 is electroluminescence spectra of GaN pn junction fabricated by the invention process. The spectra are measured at current densities of (1) 375 A/cm$^2$, (2) 600 A/cm$^2$, and (3) 900 A/cm$^2$, 4—1390 A/cm$^2$; 5—2220 A/cm$^2$; 6—3330 A/cm$^2$.
Figure 3B:
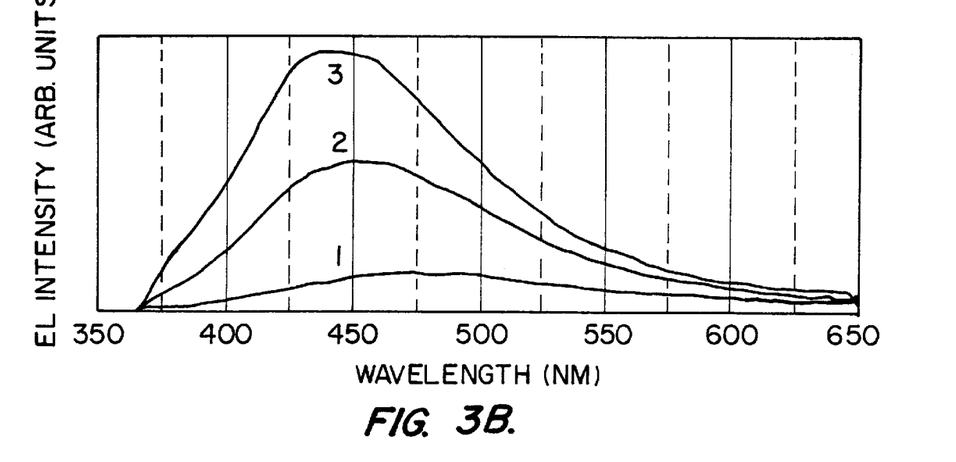

We investigated the electroluminescence (EL) properties of GaN pn-junctions fabricated by invention process. The EL spectra obtained from the typical GaN pn-junction are shown in FIG. 3. The dominant blue emission peak at 450 nm with the FWHM of about 70 nm was observed.

EMBODIMENT 2

N-AlGaN/n-GaN-p-GaN junction was formed by the invention process in two epitaxial runs. In the first run, n-type undoped AlGaN layer with AlN concentration of about 60 mol. % was grown by the HVPE method. 6H-SiC crystals were used as substrates. Growth temperature was 1100° C. The substrates were heated up to growth temperature in Ar gas ambient. Then the substrates were etched in HCl gas stream in order to remove residual surface contamination. Sapphire boats with Ga metal, Al metal, and Mg metal were placed in a separate channel tubes in the source zone of the reaction chamber.

A layer of n-type AlGaN was formed on the SiC substrate by transporting gallium as its gaseous monochloride, aluminum as trichloride, and introducing nitrogen into the growth zone in the form of ammonia gas. Growth rate of AlGaN layer was 15 microns per hour. There was no gas flow through Mg source channel.

After the growth of the first n-type layer, sample was unloaded from the reaction chamber. AlN concentration of 60 mol. % in AlGaN layer was measured by Auger electron spectroscopy. Concentration Nd—Na measured by a mercury probe in the AlGaN layer was about $1 \times 10^{17}$ cm$^{-3}$. After characterization, sample with this AlGaN layer was loaded back in the reaction chamber.

In the second epitaxial run, GaN n-type layer was grown by the procedure described in the EMBODIMENT 1. The FWHM for x-ray rocking curve for this layer was about 200 arcsec. The Nd—Na concentration was $5 \times 10^{17}$ cm$^{-3}$.

In the third epitaxial run, p-type GaN layer was grown on the surface of the second n-type GaN layer by introducing Mg impurity in the growth zone. Mg vapor provided by heated metallic Mg impurity source kept in a sapphire boat was delivered to the growth zone by Ar gas flow. The separate Ar flow was used to protect Mg gas flow. The thickness of the p-type GaN layer was 12 microns. Growth rate of p-type GaN was about 10 microns per hour. The grown structure containing n-GaN/p-GaN pn junction was cooled down up to the room temperature in an Ar atmosphere.

In all growth runs, the surface of metal sources was etched by gaseous HCl.

The grown structure was characterized by x-ray diffraction. The full width at half maximum (FWHM) of double crystal x-ray ω-scan rocking curves for (0002) GaN reflection was 180 arcsec indicating high crystal quality of the grown material. The Mg atomic concentration was $9 \times 10^{20}$ cm$^{-3}$. The $N_a$–$N_d$ concentration in p-GaN layer was about $2 \times 10^{18}$ cm$^{-3}$.

We investigated the electroluminescence (EL) properties of n-GaN/p-GaN pn-junctions fabricated by invention process. The UV emission peak at 365 nm and blue peak at 430 nm were observed.

EMBODIMENT 3

GaN p-i-n junction was produced using the invention process. First, n-type GaN layer was grown as described in the first EMBODIMENT. Then insulating GaN layer with a thickness of about 0.1 micron was grown by introducing Zn impurity in the growth zone. On the top of this insulating GaN layer, p-type GaN layer was grown as described in the first EMBODIMENT. As a result, p-i-n GaN junction was formed. Current-voltage characteristics of this p-i-n structure measured at room temperature exhibited region with negative resistively, which is typical for p-i-n structures.

EMBODIMENT 4

GaN/SiC pn junction was produced by the invention process. P-type GaN layer was grown directly on 6H-SiC n-type substrate forming pn junction between GaN and SiC. The conditions of the growth of p-type GaN layer were the same as described in the EMBODIMENT 1. Fabricated p-GaN/n-SiC pn junctions exhibited good rectifying current-voltage characteristics.

What is claimed is:

1. A method of fabricating p-type III-V material utilizing HVPE techniques, the method comprising the steps of:
   locating at least one Group III metal in a source zone of a reaction chamber;
   locating a substrate within a growth zone of said reaction chamber;
   locating at least one acceptor impurity metal in said source zone;
   introducing a halide reaction gas into said source zone to form at least one halide metal compound;
   transporting said at least one halide metal compound to said growth zone;
   introducing a reaction gas into said growth zone, said reaction gas containing at least one Group V element;
   growing a first III-V layer on said substrate, said first III-V layer formed by said reaction gas reacting with said at least one halide metal compound;
   transporting said at least one acceptor impurity metal to said growth zone; and
   growing a second III-V layer on said first III-V layer, said second III-V layer containing said at least one acceptor impurity metal, wherein said second III-V layer is a p-type III-V layer.

2. The method of claim 1, wherein a concentration of said at least one acceptor impurity metal within said second III-V layer step is in the range of $10^{19}$ to $10^{20}$ cm$^{-3}$.

3. The method of claim 1, further comprising the step of heating said substrate to a temperature of between 800° and 1200° C., wherein said heating step is performed prior to said step of transporting said at least one halide metal compound to said growth zone.

4. The method of claim 1, further comprising the step of heating said at least one Group III metal to a temperature of between 350° and 800° C., wherein said heating step is performed prior to said step of transporting said at least one halide metal compound to said growth zone.

5. The method of claim 1, further comprising the step of heating said at least one acceptor impurity metal to a temperature of between 350° and 800° C., wherein said heating step is performed prior to said step of transporting said at least one halide metal compound to said growth zone.

6. The method of claim 1, wherein said at least one Group III metal is selected from the group consisting of aluminum and gallium.

7. The method of claim 1, wherein said at least one acceptor impurity metal is selected from the group consisting of magnesium and zinc.

8. The method of claim 1, further comprising the step of flowing a transport gas through said source zone, wherein said flowing transport gas performs said transporting steps.

9. The method of claim 8, wherein said transport gas is argon gas.

10. The method of claim 1, wherein said reaction halide gas is HCl gas.

11. The method of claim 1, wherein said reaction gas introduced into said growth zone is ammonia gas.

12. The method of claim 1, wherein said first III-V layer is comprised of n-type material and a pn junction is formed between said first III-V layer and said second III-V layer.

* * * * *